United States Patent
Huckaby et al.

(10) Patent No.: US 7,539,075 B2
(45) Date of Patent: May 26, 2009

(54) IMPLEMENTATION OF A FUSING SCHEME TO ALLOW INTERNAL VOLTAGE TRIMMING

(75) Inventors: Jennifer Faye Huckaby, Raleigh, NC (US); George William Alexander, Durham, NC (US); Steven Michael Baker, Morrisville, NC (US); David SuitWai Ma, Cary, NC (US)

(73) Assignee: Infineon Technologies AG, Munich (DE)

( * ) Notice: Subject to any disclaimer, the term of this patent is extended or adjusted under 35 U.S.C. 154(b) by 16 days.

(21) Appl. No.: 11/860,332

(22) Filed: Sep. 24, 2007

(65) Prior Publication Data

US 2008/0008012 A1    Jan. 10, 2008

Related U.S. Application Data

(62) Division of application No. 11/142,023, filed on Jun. 1, 2005, now Pat. No. 7,277,350.

(51) Int. Cl.
G11C 5/14    (2006.01)
(52) U.S. Cl. .................................. 365/226; 365/189.07
(58) Field of Classification Search ............ 365/189.07, 365/225.7, 226, 189.09, 200; 323/311, 312, 323/313
See application file for complete search history.

(56) References Cited

U.S. PATENT DOCUMENTS

| 6,259,627 | B1 * | 7/2001 | Wong ..................... 365/185.21 |
| 2001/0004126 | A1 * | 6/2001 | Ohlhoff ...................... 257/528 |
| 2004/0028152 | A1 * | 2/2004 | Ma ........................... 375/317 |
| 2004/0179417 | A1 * | 9/2004 | Lehmann et al. ............ 365/226 |
| 2005/0077923 | A1 * | 4/2005 | Kim et al. ..................... 327/50 |

OTHER PUBLICATIONS

IBM Technical Disclosure Bulletin, NN81034413; "Digital Voltage Regulator for Switching Power Supplies"; Mar. 1981; vol. 23, Issue 10, p. 4413.*

* cited by examiner

*Primary Examiner*—Richard Elms
*Assistant Examiner*—Douglas King
(74) *Attorney, Agent, or Firm*—Patterson & Sheridan, L.L.P.

(57) ABSTRACT

Methods and apparatuses for adjusting trim settings for internally generated voltages of an integrated circuit device are provided. In one embodiment the apparatus receives a target digital value for an internally generated voltage, and compares the target digital value to a current digital value for the internally generated voltage. If the comparison indicates that a difference between the target digital value and the current digital value is greater than an allowable threshold, a trim setting used to trim the internally generated voltage is adjusted based on the difference. The trim setting may be adjusted until the difference between the target digital value and the current digital value is less than or equal to the allowable threshold.

13 Claims, 5 Drawing Sheets

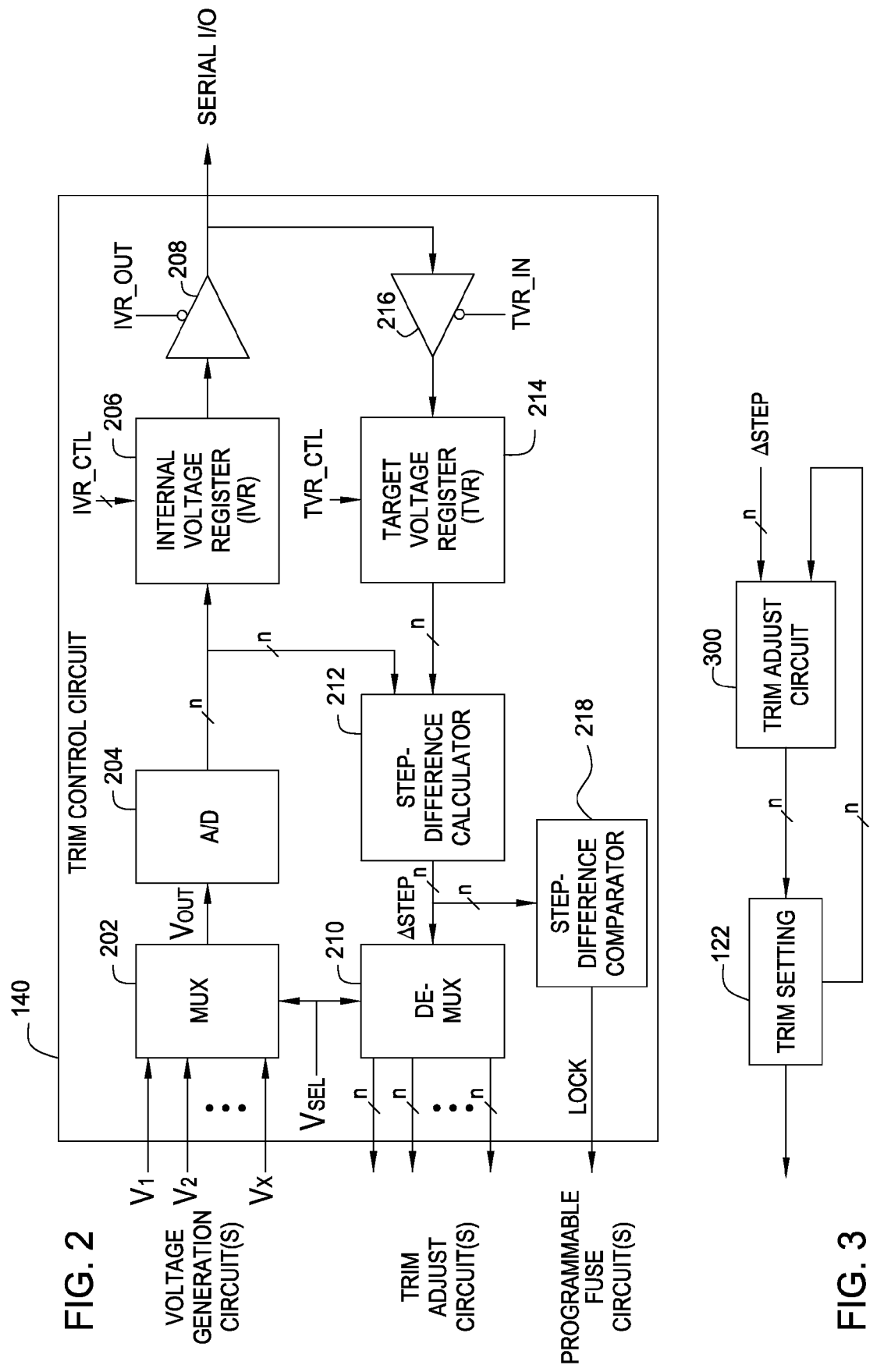

IMPLEMENTATION OF A FUSING SCHEME TO ALLOW INTERNAL VOLTAGE TRIMMING

CROSS-REFERENCE TO RELATED APPLICATIONS

This is a divisional of U.S. patent application Ser. No. 11/142,023 filed Jun. 1, 2005 now U.S. Pat. No. 7,277,350, which is herein incorporated by reference.

BACKGROUND OF THE INVENTION

1. Field of the Invention

The present invention generally relates to integrated circuit (IC) devices and, more particularly, to trimming circuits used to adjust the levels of voltages generated internally to such devices.

2. Description of the Related Art

Integrated circuit (IC) devices often operate using various internally generated voltages in an effort to reduce sensitivity to fluctuating external voltage supplies. Each internally generated voltage may also be used to perform different functions required by the IC. Internal voltage generating circuits used in such devices often include trimming circuits to adjust the internally generated voltages, for example, to compensate for variations introduced by the manufacturing process.

The trimming circuits are adjusted to bring internally generated voltages as close as possible to a target voltage during a testing procedure. Each trimming circuit may be adjusted, for example, via a set of one or more switches that may be open or closed to increase or decrease the level of the generated voltage. Typically, appropriate settings for each trim circuit are selected by a testing device (a tester) while the IC is still on a wafer and before the device has been packaged. Because each IC on the wafer may differ from each other IC, the tester may have to individually select trim settings for each IC. As a result, selecting the proper trim settings for each device may be a time-consuming process.

Another difficulty in testing each IC is establishing a connection between the tester and each IC. In order to establish the connection, the tester may use a probe card to physically connect to a number of ICs on the wafer. Due to the number of ICs on each wafer, each time a connection between the tester and wafer is established (called a touch-down), only a limited number of the ICs may be tested (and have their trim settings adjusted) at a time. Accordingly, multiple touchdowns for each wafer may be required in order to adjust all of the trim settings for each IC. The number of touch-downs necessary for an entire wafer further increases the amount of time necessary to establish trim settings for an entire wafer.

Once the appropriate trim settings for each IC have been established, each trim setting may then be saved by the tester. In order to save each trim setting, the tester may burn the settings to one or more fuses on each IC. Because the trim settings for each IC may differ, the fuses for each IC must be burned independently. In some cases, the tester may burn laser fuses to store the trim setting. In other cases, the tester may burn electronic fuses (e-fuses) to store the trim setting or the setting may be stored in some other form of non-volatile memory. In either case, independently burning the fuses for each IC on the wafer (which may require multiple touch-downs) is also a time-consuming procedure. Such excessive time requirements for performing device testing substantially reduce production efficiencies and throughput.

After the appropriate trim settings for each IC have been selected and saved, the IC may be separated from the wafer and packaged. During packaging, the IC may be connected to a package substrate and to connection pads on the substrate which route IC connections to external pins on the package. Such packaging and connections may cause heating of the IC and change the electrical characteristics of the IC and connections to the IC. Thus, trim settings, if any, selected while the IC was still on the wafer and before the IC was packaged may no longer be appropriate (i.e. the internally generated voltages may have changed) due to changes in the IC which occur during packaging.

Accordingly, what is needed are improved methods for adjusting trim settings for internally generated voltages of an integrated circuit device. There is a need to reduce or minimize the number of touchdowns on device pads required to complete testing of the devices on the wafer. Additionally, there is a need to improve efficiencies in testing time. Furthermore, there is a need for adjusting trim settings of an IC after the IC has been packaged.

SUMMARY OF THE INVENTION

Methods and apparatuses for adjusting trim settings for internally generated voltages of an integrated circuit device are provided. In one embodiment the apparatus receives a target digital value for an internally generated voltage, and compares the target digital value to a current digital value for the internally generated voltage. If the comparison indicates that a difference between the target digital value and the current digital value is greater than an allowable threshold, a trim setting used to trim the internally generated voltage is adjusted based on the difference. The trim setting may be adjusted until the difference between the target digital value and the current digital value is less than or equal to the allowable threshold.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a block diagram depicting a circuit for adjusting one or more internally generated voltages of a memory device according to one embodiment of the invention;

FIG. 3 is a block diagram depicting a circuitry for adjusting a trim setting for trimming an internally generated voltage of a memory device according to one embodiment of the invention;

DETAILED DESCRIPTION OF THE PREFERRED EMBODIMENT

Embodiments of the invention generally provide a method for adjusting an internally generated voltage of an integrated circuit device. The method includes receiving a target digital value for the internally generated voltage and comparing the target digital value to a current digital value for the internally generated voltage. If the comparison indicates that a difference between the target digital value and the current digital value is greater than an allowable threshold, a trim setting used to trim the internally generated voltage is adjusted based on the difference. The steps of comparing the target digital value and the current digital value and adjusting the trim setting are repeated until the difference between the target digital value and the current digital value is less than or equal to the allowable threshold.

The circuits described herein may be used to advantage in any number of devices that utilize internally generated voltages. However, to facilitate understanding, the following description will refer to memory devices, such as dynamic random access memory (DRAM) devices, as specific, but not limiting examples of devices in which the trimming circuits may be utilized. Further, while the following description may refer to fuses blown/cut (or left intact) to indicate the setting of a trimming circuit, those skilled in the art will recognize that such settings may also be stored in any other type of suitable non-volatile storage elements, such as bits of non-volatile memory registers. Also, while described below with reference to electronically programmable fuses (e-fuses), those skilled in the art will recognize that laser fuses may also be used to store the settings described below.

An Exemplary Testing System

Figure 1:
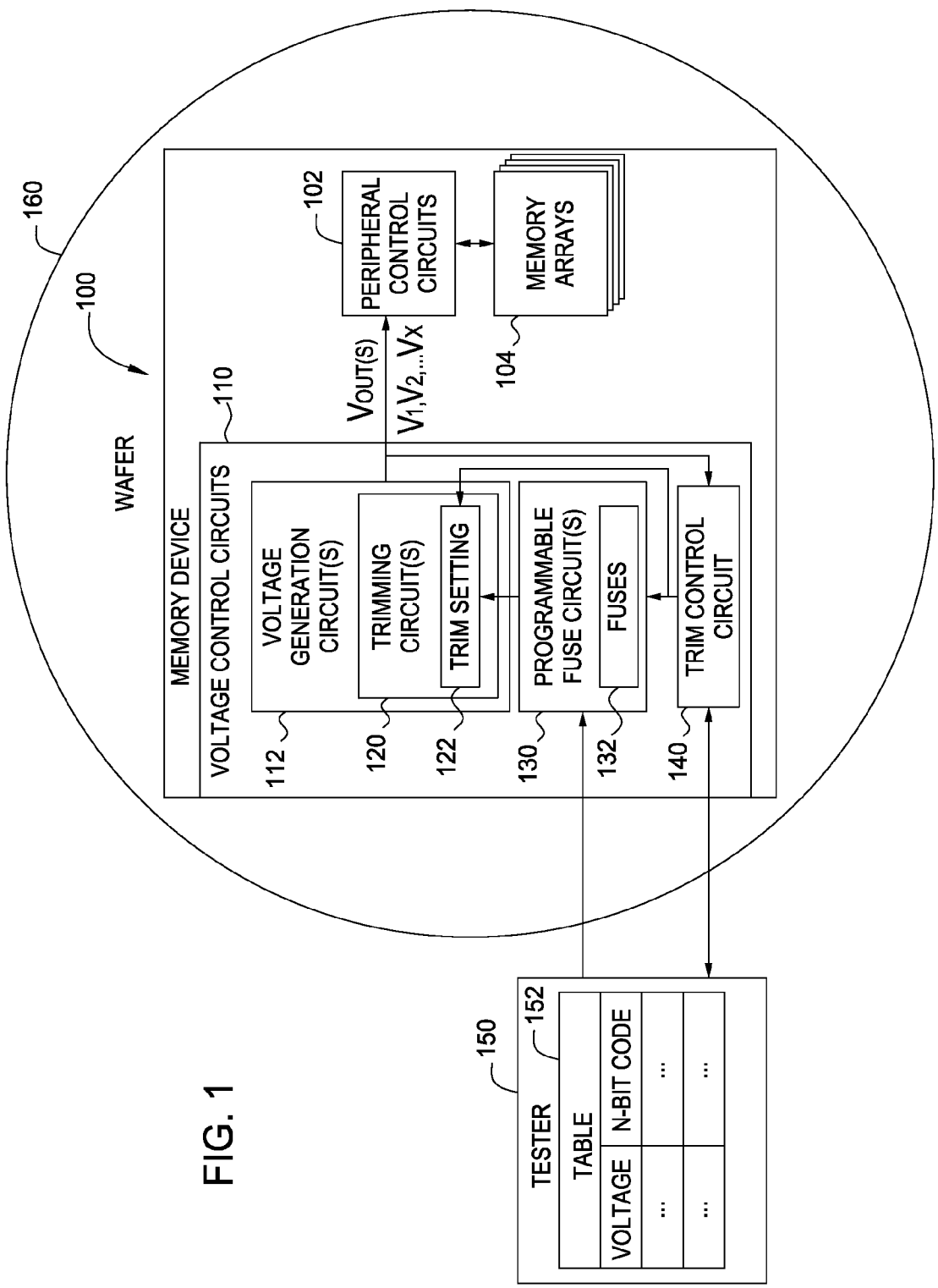
FIG. 1 is a block diagram depicting a system for testing a memory device with one or more internally generated voltages according to one embodiment of the invention.

FIG. 1 is a block diagram depicting a system for testing a memory device 100 with one or more internally generated voltages according to one embodiment of the invention. The memory device 100 may be disposed on a wafer 160 being tested by tester 150. The wafer 160 may include many other memory devices like memory device 100.

The memory device 100 may contain voltage control circuits 110. The voltage control circuits 110 may have voltage generation circuit(s) 112 which supply internally generated voltage(s) ($V_{OUT}$(s), $V_1$, $V_2$, ... $V_X$) to peripheral control circuits 102 of the memory device 100. Each internally generated voltage $V_1$, $V_2$, ... $V_X$ may be generated as a function of a reference voltage generated by a reference voltage generator and may be used by the peripheral control circuits 102 to access (e.g., read, write or refresh) memory arrays 104. A typical memory device 100, such as a dynamic random access memory (DRAM) device may include many such voltage generation circuits, configured to generate a wide range of voltages, which may include voltages that are positive with respect to a ground reference (e.g., a boosted wordline voltage) and voltages that are negative with respect to a ground reference (e.g., a back-bias voltage, or negative wordline voltage), any of which may be adjusted by separate trimming circuit 120. According to another embodiment, a single reference voltage used to generate a number of different voltages may be adjusted as described herein.

The voltage generation circuit(s) of the memory device 100 may each have trimming circuit(s) 120 used to trim the internally generated voltages $V_1$, $V_2$, ... $V_X$. Each trimming circuit 120 may be controlled by a selected trim setting 122. The trim circuit 120 may adjust the internally generated voltages $V_1$, $V_2$, ... $V_X$ up or down according to the selected trim setting 122. A separate trim setting 122 may be used for each internally generated voltage. According to another embodiment, a single trim setting 122 may be used to adjust every internally generated voltage (e.g., by adjusting a reference voltage from which each voltage is generated).

The trim settings 122 for the trimming circuit(s) 120 may either be controlled by a trim control circuit 140 or a programmable fuse circuit 130. According to one embodiment, the trim control circuit 140 may control the trim setting 122 during a testing phase of the memory device 100. After the testing phase of the memory device 100 is complete, the trim setting 122 may be saved in fuses 132 in the programmable fuse circuit 130 and the programmable fuse circuit 130 may then be used to control the trimming circuit 120 during a normal operation (e.g., non-testing) use phase of the memory device 100. Methods of selecting and storing the trim setting 122 are described in detail below.

Testing the Memory Device with the Tester

During the testing phase of the memory device 100, the trim control circuit 140 and the programmable fuse circuit 130 may be controlled by the tester 150. Thus, during the testing phase, the tester 150 may interface with the memory device 100 by physically connecting to the device 100 with a probe card during a touch-down. The input/output connections (I/O connections) made by the probe card may be used by the tester 150 to send appropriate control signals from the tester 150 to the memory device 100 and to send appropriate feedback from the memory device 100 to the tester 150. According to one embodiment of the invention, the control signals may communicate directly with the programmable fuse circuits 130 and with the trim control circuit 140. According to another embodiment of the invention, the tester 150 may control the programmable fuse circuits 130 and the trim control circuits 140 indirectly. For instance, the tester 150, or any other device connected to the memory device 100, may use commands issued to the memory device 100 to control the circuits described below. As an example, such commands may write to a control register of the memory device 100 which in turn controls the programmable fuse circuits 130 and/or the trim control circuit 140.

According to one embodiment of the present invention, the tester 150 may test a sampling of devices on the wafer 160. The sampling of devices may be used to generate a table 152 (listing voltage values with corresponding digital values) in the tester 150. The table 152 may then be used by the tester 150 to test and trim the internally generated voltages $V_1$, $V_2$, ... $V_X$ for each of the devices on the wafer 160 (described in detail below). In one embodiment of the invention, a single touch-down may be made on the wafer 160 to sample a group of devices on the wafer 160 and generate the table 152. The testing of each device on the wafer 160 may then be performed using a number of touch-downs. Each touch-down may use the table 152 to test a group of devices on the wafer 160, and a number of touch-downs may be made until all of the devices on the wafer 160 have been tested.

In another embodiment of the invention, after the sampling of devices on the wafer 160 is made using an initial touch-down, each of the devices on the wafer 160 may be tested using interconnections routed between the devices on the wafer 160. The wafer interconnections to each memory device 100 may be accessed in a single touch-down, during which each of the memory devices on the wafer 160 may be tested in parallel. In yet another embodiment of the invention, testing and trimming of internally generated voltages $V_1$, $V_2, \ldots V_X$ may be performed on each individual memory device 100 after the memory device 100 has been packaged.

Exemplary Trim Control Circuits

Once the tester 150 has established a connection to the memory device 100, the tester 150 may interact with the trim control circuit to adjust one or more internally generated voltages $V_1, V_2, \ldots V_X$ of the memory device 100.

1. Trimming Internally Generated Voltages Using a Target Digital Value

FIG. 2 is a block diagram depicting a trim control circuit 140 for adjusting one or more internally generated voltages of a memory device 100 according to one embodiment of the invention.

According to one embodiment of the invention, the trim control circuit 140 may be used to adjust an internally generated voltage as follows. The trim control circuit 140 may receive a target digital value for the internally generated voltage. After the trim control circuit 140 has received the target digital value, the trim control circuit 140 may compare the target digital value to a current digital value for the internally generated voltage. If the comparison indicates that a difference between the target digital value and the current digital value is greater than an allowable threshold, the trim control circuit 140 may adjust the trim setting based on the difference. The process of comparing the target digital value to the current digital value and adjusting the trim setting may be repeated until the difference between the target digital value and the current digital value is less than or equal to the allowable threshold. The trim control circuit may then store the adjusted trim setting in non-volatile storage located on the memory device 100.

1.A. Selecting the Internally Generated Voltage to be Trimmed

In order to adjust an internally generated voltage as described above, the voltage generation circuit(s) 112 may provide each of the internally generated voltages ($V_1, V_2, \ldots V_X$) to the trim control circuit 140. A control signal (referred to as the $V_{SEL}$ signal) may then be used as an input to multiplexer 202 to select which internally generated voltage $V_1, V_2, \ldots V_X$ to adjust. The $V_{SEL}$ signal may either be provided indirectly by control circuitry used to control the trim control circuit 140 or directly by the tester 150.

1.B. Determining the Current Digital Value for the Selected Internally Generated Voltage After $V_{SEL}$ has been set to select an internally generated voltage ($V_{OUT}$) to be adjusted, an analog to digital converter (A/D converter) may be used to convert the internally generated voltage to an n-bit digital value. The range of the A/D converter 204 (the range of voltages which the converter can convert) and the resolution of the A/D converter 204 (which determines the accuracy of voltages measured within the range) may be varied according to the range of internally generated voltages $V_1, V_2, \ldots V_X$ being measured, the desired accuracy of the voltage measurements, and the desired accuracy of the trim adjustments being made for the internally generated voltages $V_1, V_2, \ldots V_X$. In general, the resolution (and therefore accuracy) of the A/D converter 204 may be improved by selecting a larger number of bits (n) for the n-bit value output by the A/D converter 204 and designing the A/D converter 204 appropriately. Such design considerations should be readily apparent to those skilled in the art.

After the A/D converter 204 has converted the internally generated voltage to an n-bit value, the n-bit digital value may then be stored in an internal voltage register (IVR) 206. The value stored in IVR 206 is the current digital value representing the internally generated voltage, and may be compared to a target digital value representing a target voltage to determine whether to trim the internally generated voltage. Selection of a target digital value is described below.

1.C. Generating and Selecting the Target Digital Values Provided by the Tester

According to one embodiment of the invention, the target digital value for the selected internally generated voltage may be provided by the tester 150. As described above, target voltages and corresponding n-bit target digital values for each target voltage may be stored in a table 152 within the tester 150. The tester 150 may generate the table 152 by using the probe card to touch down on a sampling of devices. For instance, in a single touch down, the probe card may connect the tester 150 to multiple devices in parallel. The tester 150 may then test each of the devices to determine which internal voltage values correspond to which n-bit digital values according to one embodiment of the invention.

To determine which internal voltage values correspond to which n-bit digital values, the tester 150 may first use $V_{SEL}$ to select an internally generated voltage. The internally generated voltage may then be converted into an n-bit digital value by the A/D converter 204. The n-bit digital value for the internally generated voltage may then be stored in IVR 206. The tester 150 may then use the serial I/O connection to read the n-bit digital value in IVR 206. Reading IVR 206 using the serial I/O connection may include using one or more control signals for IVR 206 (the signals as a group may be referred to as IVR_CTL) to serially output the n-bit value from IVR 206. An output buffer 208 controlled by an output control signal (IVR_OUT) may connect serial output from IVR 206 to the serial I/O interface.

The process of reading each internally generated voltage $V_1, V_2, \ldots V_X$ and corresponding n-bit value from the serial I/O interface may be repeated for each device being sampled by the tester 150. The process may be performed on all of the sampled devices connected to the tester 150 by the probe card during a single touch-down in parallel. Based on the sampling, the table 152 of voltages and n-bit values may be created. Because each of the memory devices on the wafer 160 are subjected to the same fabrication processes as each of the other devices on the wafer 160, the n-bit values for the sampled devices should be accurate when used to trim the internally generated voltages $V_1, V_2, \ldots V_X$ for the other devices on the wafer 160. Thus, after the table 152 has been created, the tester 150 may then use the table 152 to select target digital values for each internally generated voltage being trimmed on each device.

1.D. Trimming the Internally Generated Voltage Using the Selected Target Digital Value Once the target voltage digital value is determined by the tester 150 using the table 152, the target digital value may be written to each memory device 100 being tested. According to one embodiment of the invention, writing the target digital value may be accomplished using the serial I/O interface on the trim control circuit 140. Thus, the tester 150 may serially output the target digital value to the trim control circuit 140. The target voltage value may be written to the target voltage register (TVR) 214. TVR 214 may be controlled by one or more control signals (TVR_CTL), and the value output by the tester 150 may be made available to TVR 214 using an input buffer 216 controlled by an input control signal (TVR_IN).

After the target digital value has been written to TVR 214 and after the current digital value for the internally generated voltage has been selected and loaded into IVR 206 (as described above) from A/D converter 204, the difference between the target digital value and the current digital value may be determined, for example, using the step-difference calculator 212. The output of the step-difference calculator 212 may be an n-bit number representing the difference between the target digital value and the current digital value (referred to as $\Delta_{STEP}$).

Once $\Delta_{STEP}$ is determined by the step-difference calculator 212, $\Delta_{STEP}$ may be input to a step-difference comparator 218 and a de-multiplexer 210.

The comparator 218 may determine whether $\Delta_{STEP}$ is greater than an allowable threshold. If $\Delta_{STEP}$ is greater than the allowable threshold, $\Delta_{STEP}$ may be used to adjust the trim setting 122 for the selected internally generated voltage being trimmed. In other words, if the difference between the current digital value for the internally generated voltage and the target digital value is too great, the internally generated voltage may be trimmed so that the current digital value for the internally generated voltage may be made closer to the target digital value. If, however, the difference between the current digital value for the internally generated voltage and the target digital value is less than or equal to the allowable threshold, the internally generated voltage may be acceptable and no further trimming may be required.

The allowable threshold may be chosen according to several considerations. If the exact value of the internally generated voltage is not relatively important or if the trimming circuits 120 and A/D converter 204 are not relatively accurate, a larger allowable threshold may be chosen. If, however, the exact value of the internally generated voltage is important (e.g. if the peripheral control circuits are sensitive to the internally generated voltage) and if the trimming circuits 120 and A/D converter 204 are relatively accurate, a smaller allowable threshold may be chosen. These and other such design considerations affecting the choice of the allowable threshold should be readily apparent to one of ordinary skill in the art.

After $\Delta_{STEP}$ has been compared to the allowable threshold, it may be determined that $\Delta_{STEP}$ is greater than the allowable threshold. If $\Delta_{STEP}$ is greater than the allowable threshold, $\Delta_{STEP}$ may be output by the de-multiplexer 210 to a trim adjust circuit for the internally generated voltage being trimmed. The trim adjust circuit may be used to adjust the trim setting based on $\Delta_{STEP}$. Because each internally generated voltage may have an independent trim setting 122 and trimming circuit 120, a separate trim adjust circuit may be provided for each internally generated voltage. To select the appropriate trim adjust circuit for the internally generated voltage being trimmed, the de-multiplexer 210 may be controlled by the same control signal $V_{SEL}$ used by multiplexer 202 to select the internally generated voltage being converted to the current digital value.

FIG. 3 is a block diagram depicting a trim adjust circuit 300 for adjusting a trim setting of an internally generated voltage of a memory device 100 according to one embodiment of the invention. $\Delta_{STEP}$ (the difference between the current digital value for the internally generated voltage and the target digital value) may be input to the trim adjust circuit 300. The current trim setting 122 may also be input to the trim adjust circuit 300 in a feedback loop. The trim adjust circuit 300 may use $\Delta_{STEP}$ and the trim setting 122 to adjust and set a new trim setting 122.

The trim adjust circuit 300 may adjust the trim setting 122 in several manners according to different embodiments of the invention. According to one embodiment of the invention, $\Delta_{STEP}$ may be a signed value and the trim adjust circuit may add or subtract $\Delta_{STEP}$ to the current trim setting 122 to determine the new trim setting. Thus, the trim setting 122 may be adjusted based on the size of the difference between the current digital value for the internally generated voltage and the target digital value.

According to another embodiment of the invention, $\Delta_{STEP}$ may be a signed number but the trim adjust circuit 200 may only adjust the trim setting 122 in increments or decrements (i.e. one step at a time) regardless of the size of $\Delta_{STEP}$. In yet another embodiment of the invention, a default trim setting may be provided which is at an absolute lower or higher end of the possible ranges for the internally generated voltage. The default trim setting may then be adjusted in only one direction (monotonically, either up or down) based on an unsigned step-difference $\Delta_{STEP}$. Such adjustments may either be based on the size of $\Delta_{STEP}$ or such adjustments may be incremental.

Once the trim setting 122 has been adjusted by the trim adjust circuit 300, the trimming circuit 120 for the internally generated voltage may trim the voltage according to the new trim setting 122. Thus, the voltage generation circuit 112 will provide a new internally generated voltage to the trim control circuit 140. The new internally generated voltage may then be selected by multiplexer 202, converted to an n-bit digital value by A/D converter 204, and stored in IVR 206. The step difference $\Delta_{STEP}$ between the new digital value corresponding to the trimmed internally generated voltage and the target digital value stored in TVR 214 may then be calculated by the step difference calculator 212. $\Delta_{STEP}$ may then be compared again to the allowable threshold by the step difference comparator 218. If $\Delta_{STEP}$ is still not within the allowable threshold, the process of adjusting the trim setting 122, recalculating the current digital value for the trimmed internally generated voltage, and determining $\Delta_{STEP}$ may be repeated until $\Delta_{STEP}$ is less than or equal to the allowable threshold. Because each change to the trim control setting 122 may take time to propagate through the trimming circuits 120, voltage generation circuits 112, and trim control circuit 140, timing control circuitry (not depicted) may be used to synchronize each iterative calculation of $\Delta_{STEP}$ and to synchronize adjustment to the trim setting 122.

While one or more adjustments to the trim setting 122 are described above, it is possible that the initial trim setting 122 for the internally generated voltage and the resulting current digital value corresponding to the internally generated voltage may be close enough to the target digital value so that adjustments to the trim setting 122 are not required. Thus, the initial $\Delta_{STEP}$ value may be less than or equal to the allowable threshold, and no trim setting adjustments may be required.

1.E. Storing the Trim Setting

When the step difference comparator 218 determines that $\Delta_{STEP}$ is less than or equal to the allowable threshold, the comparator 218 may issue a lock signal to the programmable fuse circuit 130 for the internally generated voltage. According to one embodiment of the invention, the lock signal may indicate to the programmable fuse circuit 130 that a trim setting 122 is ready to be saved by blowing the fuses 132 for that trim setting 122. According to another embodiment of the invention, the lock signal may be sent to the tester 150. The tester 150 may then read the current digital value stored in IVR 206 and use that value to later burn laser fuses on the memory device 100, thus storing the trim setting 122. In yet another embodiment, the lock signal may be used to store each trim setting 122 in some other form of non-volatile memory on or off the memory device 100. When the memory device 100 is powered-up, the stored trim settings may then be loaded by the memory device 100 during an initialization stage. The loaded trim settings may then be used by the trimming circuits 120 to trim the internally generated voltages $V_1, V_2, \ldots V_X$ accordingly.

In another embodiment of the invention, the trim settings 122 for each internally generated voltage $V_1, V_2, \ldots V_X$ may be calculated before any of the fuses 132 are burned. After each trim setting 122 has been calculated, each of the fuses 132 in each of the programmable fuse circuits 130 may be programmed in parallel as necessary.

Figure 4:
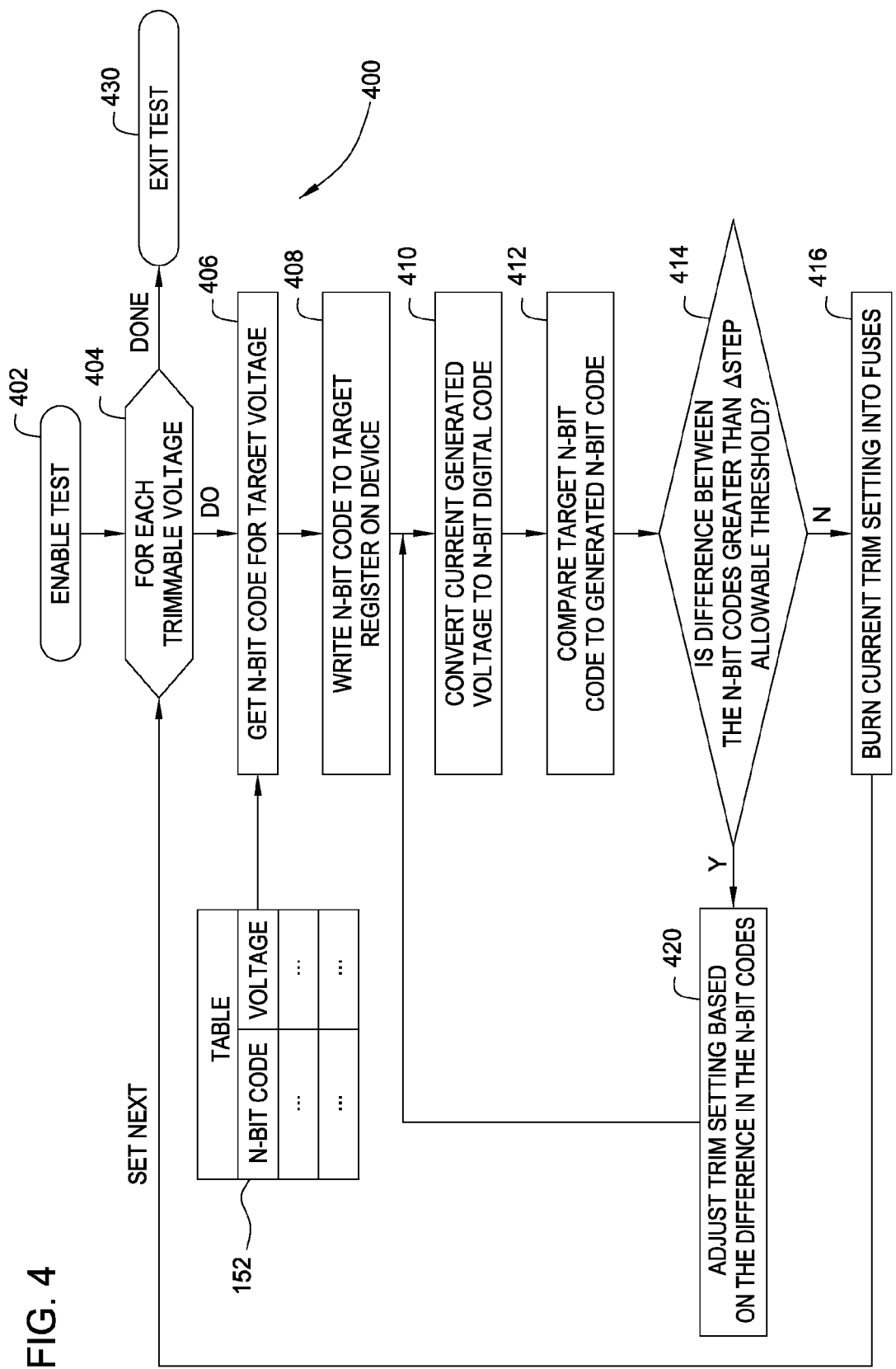
FIG. 4 is a flow chart depicting a process for adjusting a trim setting for trimming an internally generated voltage of a device according to one embodiment of the invention.

1.F. Exemplary Process for Adjusting the Trim Setting Using the Trim Control Circuit FIG. 4 is a flow chart depicting an exemplary process 400 for adjusting a trim setting 122 for trimming an internally generated voltage of a memory device 100 according to one embodiment of the invention. The process 400 may begin at step 402 and continue to step 404 where a loop is entered. An n-bit code for the target voltage for the trimmable voltage may be received at step 406. Illustratively, the n-bit code for the target voltage may be obtained from the table 152 stored in the tester 150. At step 408 the n-bit code may be written to a target register (e.g. TVR 214) on the memory device 100. At step 410, a current generated voltage may be converted to an n-bit digital code, and, at step 412 the target n-bit code may be compared to the generated n-bit code (e.g. using step difference calculator 212).

At step 414, a determination may be made of whether the difference between the n-bit codes ($\Delta_{STEP}$) is greater than the allowable threshold. If the difference is greater than the allowable threshold, the trim setting 122 may be adjusted at step 420 based on the difference $\Delta_{STEP}$ between the n-bit codes. The steps 410, 412, and 414 of generating the n-bit digital code and comparing the generated n-bit digital code to the target n-bit digital code may then be repeated. If, at step 414, it is determined that the $\Delta_{STEP}$ difference is not greater than the allowable threshold, the current trim setting may be burned into fuses 132 and the loop beginning at step 404 may be continued for each of the remaining trimmable voltages. After each trimmable voltage has been trimmed, the test may be exited at step 430.

2. Trimming Internally Generated Voltages Using an Externally Provided Trim Setting According to one embodiment of the invention, the tester 150 may also be used to adjust the trim setting 122 for each internally generated voltage rather than the trim control circuit 140. For instance, the tester 150 may be configured to send a trim setting 122 to the memory device 100. The tester 150 may then measure an internal voltage generated by an internal voltage generator of the memory device 100 and adjusted by the trimming circuit 120 using the trim setting 122. The tester 150 may then read out/receive the adjusted internal voltage and compare it to a target voltage. If the comparison indicates that a difference between the target voltage and the adjusted internal voltage is greater than an allowable threshold, the tester 150 may adjust the trim setting. The tester 150 may repeat the steps of measuring the adjusted internal voltage and comparing it to the target voltage until the difference between the internal voltage and the target voltage is less than or equal to the allowable threshold. The tester 150 may then cause one or more fuses of the memory device 100 to be altered to store the adjusted trim setting.

Figure 5:
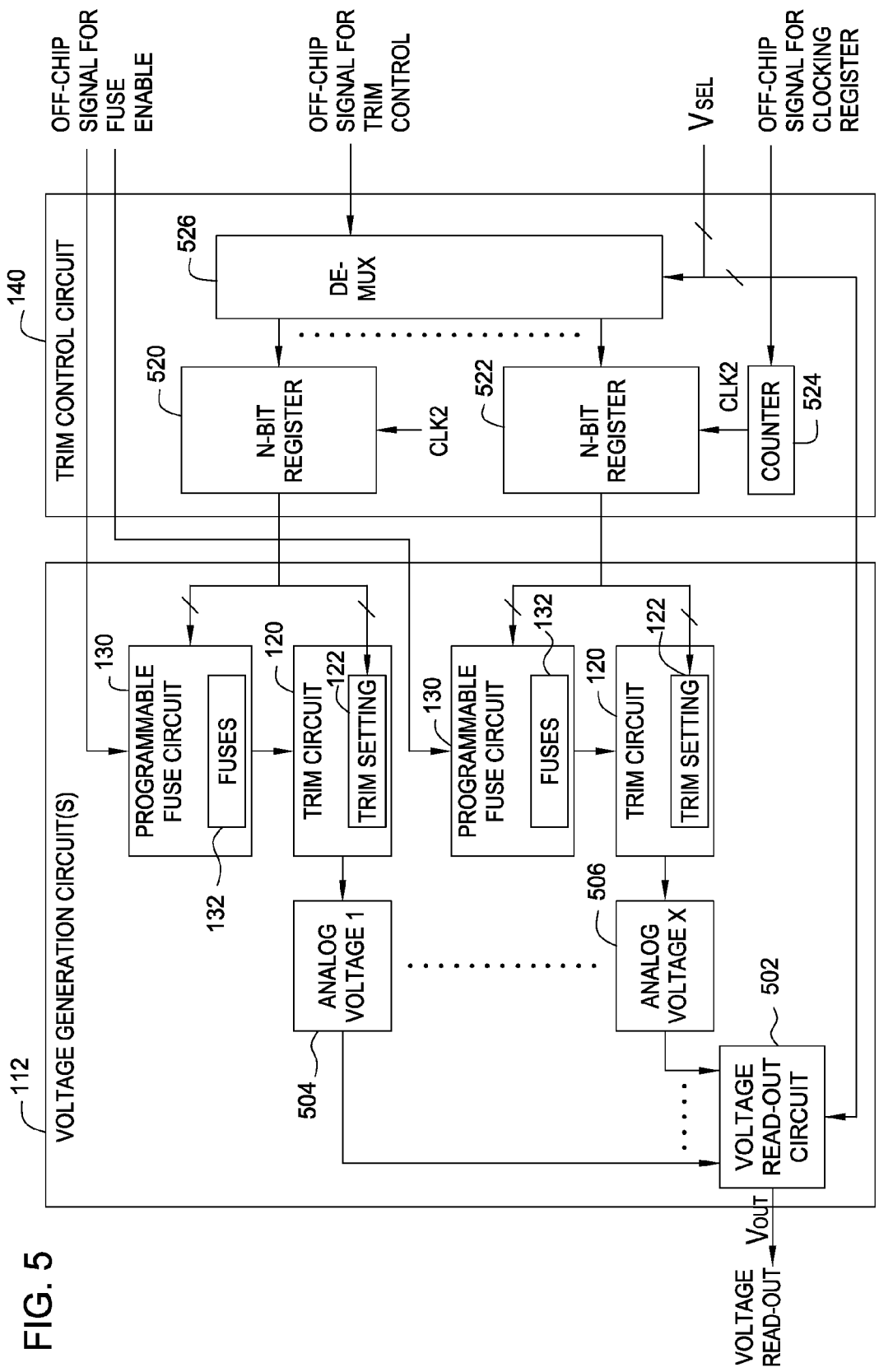
FIG. 5 is a block diagram depicting circuitry for trimming one or more internally generated voltages of a device using an externally provided trim setting according to one embodiment of the invention.

According to one embodiment of the invention, the trim control circuit 140 and the voltage generation circuit(s) 112 of the memory device 100 may be used by the tester 150 to test the memory device 100 and adjust each internally generated voltage. FIG. 5 is a block diagram depicting circuitry for trimming one or more internally generated voltages $V_1, V_2, \ldots V_X$ of a device using an externally provided trim setting according to one embodiment of the invention.

2.A. Selecting the Internally Generated Voltage to be Trimmed

Before adjustments to a trim setting for an internally generated voltage are made, the tester 150 may select one of the internally generated voltages $V_1, V_2, \ldots V_X$ to be trimmed. Each internally generated voltage may be generated by a separate analog voltage generator 504, 506. The tester 150 may select the voltage to be trimmed using a selection signal ($V_{SEL}$) provided by the tester 150. $V_{SEL}$ may be used by a voltage read-out circuit 502 to read out the selected internally generated voltage (the voltage being read out may be referred to as $V_{OUT}$). The generated voltage $V_{OUT}$ may then be routed to an appropriate contact point and read by the tester 150.

2.B. Determining Whether to Trim the Internally Generated Voltage

After the tester 150 has read the internal voltage VOUT, the tester 150 may compare $V_{OUT}$ to a desired value for the internal voltage, referred to as the target voltage. According to one embodiment of the invention, the tester 150 may compare $V_{OUT}$ to the target voltage by converting both voltages to n-bit digital values using A/D converters and comparing the n-bit values to determine a difference. According to another embodiment of the invention, the difference between $V_{OUT}$ and the target voltage may be determined using analog circuitry to compare to the two voltages. The output of the analog circuitry may be an analog value representing the difference between the two voltages, and the analog value may then be converted to an n-bit digital value representing the difference using an A/D converter.

In either case, the difference between $V_{OUT}$ and the target voltage may be used by the tester 150 to determine whether to select a new trim setting 122 for the internally generated voltage. If the difference between $V_{OUT}$ and the target voltage is less than or equal to an allowable threshold, trim setting adjustments may not be required. If, however, the difference is greater than the allowable threshold, the tester 150 may adjust the trim setting 122 for the internally generated voltage.

According to one embodiment of the invention, if the difference between $V_{OUT}$ and the target voltage is greater than the allowable threshold, the trim setting 122 for the internally generated voltage may be adjusted according to the size of the difference between the voltages as well as the sign of the difference (i.e. whether $V_{OUT}$ is less than the target voltage or greater than the target voltage). According to another embodiment of the invention, the trim setting adjustment may also be made in other ways as described above with respect to FIG. 3 (e.g. incrementally adjusting the trim setting 122, monotonically adjusting the trim setting 122, etc. as described above).

2.C. Trimming the Internally Generated Voltage Using a Trim Setting

Once the tester 150 has selected an adjusted trim setting, the adjusted trim setting may be output by the tester 150 to the trim control circuit 140 of the memory device 100. The tester 150 may use one or more control signals issued to the trim control circuit 140 to cause the trim control circuit 140 to read the adjusted trim setting. As illustrated, the tester 150 may provide the adjusted trim control setting as a serial input (labeled in FIG. 5 as "off-chip signal for trim control") to the trim control circuit 140. The tester 150 may also provide a clock signal (labeled "off-chip signal for clocking register") to the trim control circuit 140.

Because the memory device 100 may have more than one internally generated voltage, one or more n-bit registers 520, 522 in the trim control circuit 140 may be used to store adjusted trim settings 122 for each of the internally generated voltages $V_1, V_2 \ldots V_X$. The tester 150 may use the $V_{SEL}$ signal (the same signal used to select the internally generated voltage output by voltage read-out circuit 502) to control a de-multiplexer 526. The de-multiplexer 526 may output the off-chip signal for trim control to the appropriate n-bit register 520, 522 which may store the adjusted trim setting for the corresponding internally generated voltage. Each of the n-bit registers 520, 522 may be clocked by a counter 524, and the counter 524 may be controlled by the off-chip signal for the clocking register. Thus, the off-chip signal for trim control, $V_{SEL}$, and the off-chip signal for the clocking register may be used to store the adjusted trim setting in the appropriate n-bit register 520, 522.

After the adjusted trim setting is stored in the appropriate n-bit register 520, 522, the previous trim setting 122 may be replaced by the adjusted trim setting and the trim circuit 120 may trim the internally generated voltage according to the adjusted trim setting. After the internally generated voltage has been trimmed, the voltage ($V_{OUT}$) may again be read by the tester 150 from the voltage read-out circuit 502. If further adjustments are needed (e.g. if the difference between $V_{OUT}$ and the target voltage is greater than the allowable threshold), the tester 150 may further adjust the trim setting 122 by repeating the steps described above.

2.D. Storing the Trim Setting

Once an appropriate trim setting 122 has been established, the trim setting 122 may by stored. According to one embodiment of the invention, the trim setting 122 may be stored by the programmable fuse circuit 130 upon receiving one or more external signals from the tester 150. As illustrated, the tester 150 may provide an off-chip signal for fuse enable. The off-chip signal for fuse enable may cause the appropriate programmable fuse circuit 130 to program the trim setting 122 into the appropriate fuses 132. Thus, when the memory device 100 is later powered-up, the trim circuit 120 may be controlled by the trim setting 122 stored in the fuses 132.

According to one embodiment of the invention, all of the fuses 132 for all of the programmable fuse circuits 130 on the memory device 100 may be burned in parallel. This may be accomplished by determining each of the trim settings 122 for each of the internally voltages $V_1, V_2 \ldots V_X$ and then issuing the off-chip signal for fuse enable to each programmable fuse circuit 130, causing each of the trim settings 122 to be stored simultaneously. The trim setting 122 for each of the internally voltages $V_1, V_2 \ldots V_X$ may also be stored in different ways according to other embodiments of the invention. For instance, as described above, the trim setting 122 may be stored in another type of non-volatile memory.

Figure 6:
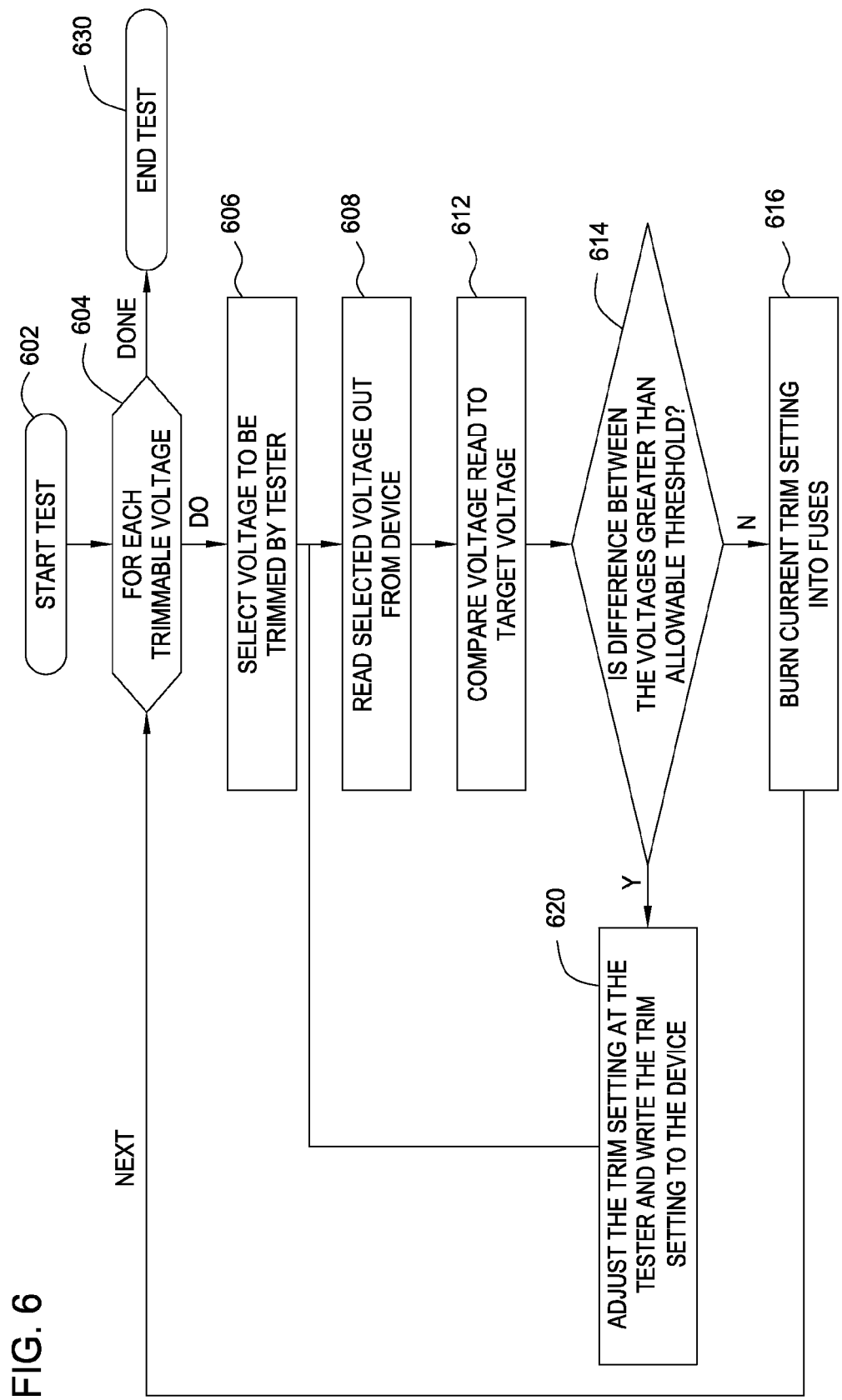
FIG. 6 is a flow chart depicting a process for adjusting a trim setting, wherein the trim setting is adjusted by an external tester, according to one embodiment of the invention.

2.E. Exemplary Process for Adjusting the Trim Setting Using the Tester 150 and the Trim Control Circuit FIG. 6 is a flow chart depicting an exemplary process 600 for adjusting a trim setting 122, wherein the trim setting 122 is adjusted by the tester 150, according to one embodiment of the invention. The process 600 may begin at step 602 when the test is started and continue to step 604 where a loop is entered. The loop may be performed once for each trimmable voltage in the memory device 100. At step 606 the internally generated voltage to be trimmed may be selected by the tester 150 (e.g., via $V_{SEL}$ signals). At step 608, the selected internally generated voltage may be read out from the memory device 100. The voltage read out by the tester 150 (via read-out circuit 502) may then be compared to the target voltage at step 612.

At step 614, a determination may be made of whether the difference between the voltages is greater than the allowable threshold. If the difference between the voltages is greater than the allowable threshold, the trim setting 122 may be adjusted by the tester 150 and written to the memory device 100 at step 620. The steps 608, 612, 614 of reading out the selected voltage, comparing the read voltage to the target voltage, and determining if the difference between the voltages is greater than the allowable threshold may then be repeated until the difference is less than or equal to the allowable threshold.

If the difference between the voltages is not greater than the allowable threshold, the trim setting 122 may burned into the fuses 132 on the memory device 100 at step 616 and the loop beginning at step 604 may be continued for each of the remaining trimmable voltages. After each trimmable voltage has been trimmed, the test may be exited at step 630.

VARIATIONS OF THE DESCRIBED EMBODIMENTS

While the foregoing is directed to embodiments of the present invention, other and further variations of the described embodiments of the invention are contemplated.

In another embodiment of the invention, once each trim setting 122 has been adjusted, the adjusted trim setting 122 may be read out and stored for future use. For instance, the stored trim settings may accessed by a processor connected to the memory device 100. When the processor initializes the memory device 100, the stored trim settings may be written to the memory device 100 and used to trim the internally generated voltages $V_1, V_2, \ldots V_X$ of the memory device 100.

According to another embodiment of the invention, trim settings 122 for several sets of target voltages may be calculated, where each set of target voltages represents a different mode of the memory device 100 (e.g. high power, low power, etc. . . . ). Each set of trim settings may then be used by a processor to change modes accordingly. For instance, while a product (e.g. a cell phone, laptop, or PDA) containing the memory device 100 is plugged into a power outlet, a first set of trim settings corresponding to a high power mode may be used by the memory device 100. If the product is unplugged, a second set of trim settings corresponding to a low power mode may be used by the memory device 100.

According to another embodiment of the invention, multiple sets of trim settings may be calculated at multiple manufacturing stages of the memory device 100. For instance, a first set of trim settings may be calculated while the memory device 100 is still on the wafer 160. Such trim settings may be calculated, for example, using the trim control circuit described with respect to FIG. 2, and the first set of trim settings may be stored in a first set of fuses.

A second set of trim settings may be calculated after the memory device 100 has been separated from the wafer 160 and packaged. The second set of trim settings may be useful, for example, if the process of packaging the memory device 100 (which may cause heating of the memory device 100) caused fluctuations in the internally generated voltages $V_1$, $V_2, \ldots V_X$ such that the first set of trim settings is no longer valid. The second set of trim settings may be calculated, for example, using the trim control circuit described with respect to FIG. 5, and the second set of trim settings may be stored in a second set of fuses. Another fuse (e.g. a master fuse) may then be blown. Blowing the master fuse may cause the memory device 100 to use the second set of trim settings instead of the first set of trim settings. According to another embodiment of the invention, the first set of fuses and the second set of fuses may be different types of fuses. For instance, the first set of fuses may be laser fuses, and the second set of fuses may be electronically programmable fuses.

While the foregoing is directed to embodiments of the present invention, other and further embodiments of the invention may be devised without departing from the basic scope thereof, and the scope thereof is determined by the claims that follow.

What is claimed is:

1. A method for adjusting a trim setting used to trim a plurality of internally generated voltages of an integrated circuit, comprising:
    (a) receiving a target digital value for each of the plurality of internally generated voltages;
    (b) comparing the target digital value to a current digital value for each of the plurality of internally generated voltages;
    (c) adjusting the trim setting, for each of the plurality of internally generated voltages, based on a difference if the comparison indicates that the difference between the target digital value and the current digital value is greater than an allowable threshold; and
    (d) repeating steps (b) and (c) for each of the plurality of internally generated voltages until the difference between the target digital value and the current digital value is less than or equal to the allowable threshold; whereby the plurality of internally generated voltages are each trimmed independently of each other according to steps (a) through (d).

2. The method of claim 1, further comprising storing the adjusted trim setting in non-volatile storage on the device.

3. The method of claim 1, wherein adjusting the trim setting comprises:
    calculating a difference between the target digital value and the current digital value; and
    arithmetically applying the difference to a current trim setting to determine the adjusted trim setting.

4. The method of claim 1, wherein adjusting the trim setting comprises:
    calculating a difference between the target digital value and the current digital value; and
    producing the adjusted trim setting by performing one of: (i) adding the difference to a current trim setting in increments and (ii) subtracting the difference in decrements.

5. The method of claim 1, wherein adjusting the trim setting comprises:
    providing a default trim setting at an absolute lower or higher end of possible ranges for the internally generated voltage;
    calculating an unsigned step difference between the target digital value and the current digital value; and
    arithmetically applying the unsigned step difference to the default trim setting to determine the adjusted trim setting.

6. The method of claim 5, wherein arithmetically applying the unsigned step difference is done by performing one of: (i) adding the difference to a current trim setting in increments and (ii) subtracting the difference in decrements.

7. The method of claim 1, adjusting the internally generated voltage based on the adjusted trim setting.

8. A method for adjusting a plurality of internally generated voltages, comprising:
    (a) receiving a target digital value for each of the internally generated voltages;
    (b) comparing the target digital value to a current digital value for each of the plurality of internally generated voltages;
    (c) adjusting a trim setting, for each of the plurality of internally generated voltages, based on a difference if the comparison indicates that the difference between the target digital value and the current digital value is greater than an allowable threshold;
    (d) repeating steps (b) and (c) for each of the plurality of internally generated voltages until the difference between the target digital value and the current digital value is less than or equal to the allowable threshold; and
    (e) programming one or more fuses to store the adjusted trim setting for each of the plurality of internally generated voltages; whereby the plurality of internally generated voltages are each trimmed independently of each other according to steps (a) through (e).

9. The method of claim 8, wherein adjusting the trim setting comprises:
    calculating a signed step difference between the target digital value and the current digital value;
    adding the signed step difference to a current trim setting to determine an adjusted trim setting; and
    adjusting the internally generated voltage using the adjusted trim setting.

10. The method of claim 8 wherein programming one or more fuses to store the adjusted trim setting comprises electronically blowing the one or more fuses.

11. The method of claim 8, wherein adjusting the trim setting comprises:
    calculating a signed step difference between the target digital value and the current digital value;
    adding the signed step difference in increments to a current trim setting to determine an adjusted trim setting; and
    adjusting the internally generated voltage using the adjusted trim setting.

12. The method of claim 8, wherein adjusting the trim setting comprises:
    providing a default trim setting at one of an absolute lower end and absolute higher end of possible ranges for the internally generated voltage;
    calculating an unsigned step difference between the target digital value and the current digital value;
    arithmetically applying the unsigned step difference to the default trim setting to determine an adjusted trim setting; and
    adjusting the internally generated voltage using the adjusted trim setting.

13. The method of claim 12, wherein arithmetically applying the unsigned step difference is done by performing one of: (i) adding the difference to a current trim setting in increments and (ii) subtracting the difference in decrements.

* * * * *